United States Patent [19]

Kunitoki et al.

[11] Patent Number: 4,730,129

[45] Date of Patent: Mar. 8, 1988

[54] INTEGRATED CIRCUIT HAVING FUSE CIRCUIT

[75] Inventors: Tadayoshi Kunitoki, Yokohama; Kunihiko Gotoh, Kunitachi, both of Japan

[73] Assignee: Fujitsu Limited, Kawasaki, Japan

[21] Appl. No.: 703,987

[22] Filed: Feb. 21, 1985

[30] Foreign Application Priority Data

Feb. 29, 1984 [JP] Japan ................................. 59-037927

[51] Int. Cl.[4] ......................... H03K 5/20; H03K 19/40
[52] U.S. Cl. ................................. 307/362; 307/202.1; 307/363; 307/231; 307/303
[58] Field of Search ...................... 307/363, 362, 202.1, 307/303, 231; 365/200, 201, 96

[56] References Cited

U.S. PATENT DOCUMENTS

| | | | |
|---|---|---|---|
| 4,104,546 | 8/1978 | Seiler | 307/362 |
| 4,446,534 | 5/1984 | Smith | 365/96 |
| 4,532,607 | 7/1985 | Uchida | 307/202.1 |

FOREIGN PATENT DOCUMENTS

0043300  3/1985  Japan.

*Primary Examiner*—Stanley D. Miller
*Assistant Examiner*—Richard Roseen
*Attorney, Agent, or Firm*—Staas & Halsey

[57] ABSTRACT

This invention is related to an integrated circuit (IC) having a fuse circuit. In such an IC device, it is very difficult to hold a specific gain of the IC because of a leakage of a gap between the fuse terminals called "re-glown fuse" or "glown-back fuse", and the IC suffers from malfunction. The present invention provides a fuse circuit to detect whether a fuse has been blown or not, by judging whether the fuse resistance is larger or smaller compared to a predetermined threshold resistor, which generates a judging potential corresponding to a fuse condition. Thus the IC can be used without malfunction.

12 Claims, 11 Drawing Figures

INTEGRATED CIRCUIT HAVING FUSE CIRCUIT

BACKGROUND OF THE INVENTION

This invention relates to an integrated circuit having a fuse circuit, and in particular, to a fuse circuit which detects whether the fuse has been blown or not by judging whether the fuse resistance is larger or smaller compared to that of a predetermined threshold resistor.

An integrated circuit (IC) having fuse circuits is becoming increasing popular. It is well known that the characteristics of an IC may be above or below its rated characteristics due to fluctuation of its fabrication process. For example, the characteristics of an IC having a built-in reference voltage may vary from its rated characteristics because of such fluctuations. In order to reduce such variations, each IC chip has been trimmed in the prior art. The chip trimming is often performed by a fuse circuit. For example, the fuse circuit is connected to a D/A converter circuit, to control precisely its reference voltage by the fuse circuit. The fuse circuit is capable of adjusting the gain between the input and output signal by blowing the fuse by applying a high current.

Figure 1:
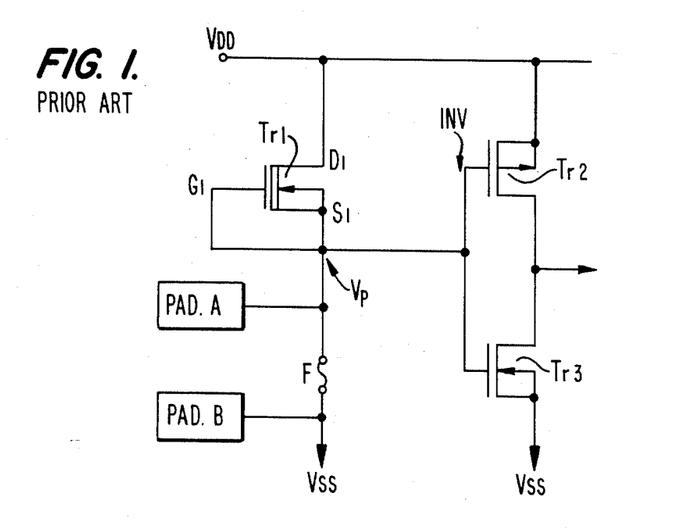
FIG. 1 is a circuit diagram of a prior art fuse circuit.

FIG. 1 is a conventional fuse circuit for trimming. In the figure, a first field effect transistor (FET) Tr1 is an n-channel depletion type transistor. In order to provide a function of constant current source, the gate electrode G1 of the first FET Tr1 is connected to its source S1. A fuse circuit is formed by the first FET Tr1 and a fuse F, which are connected in series between a positive voltage source $V_{DD}$ and a negative voltage source $V_{SS}$. A junction point of the source S1 of the first FET Tr1 and the fuse F is connected to an input terminal of an inverter INV for example which detects whether the fuse is blown or not. The inverter INV is composed of a complementary metal oxide semiconductor (CMOS) transistors including an enhancement type p-MOS transistor Tr2 and an n-channel MOS transistor Tr3.

The fuse F is blown by applying a high current at terminal pads PAD. A and B. The judging of whether the fuse F has been blown or not is done by checking whether an on-state resistance of the first FET Tr1 is larger or smaller compared with a resistance $R_F$ of the fuse F. Namely, when the fuse F is blown a judging potential Vp at the junction point rises up to a high potential level "H", and it is applied to the input of the inverter INV, for example. The output of the inverter INV then becomes low potential level "L". On the contrary, if the fuse F has not been blown, the judging potential Vp at the junction point is the same potential of the negative voltage source Vss, namely the low potential level "L". Then an output of the inverter INV becomes high potential level "H".

Generally, in such a conventional fuse circuit, in order to decrease a power dissipation of the fuse circuit, the on-state resistance of the first FET Tr1 is designed to be larger than that of the fuse F. For example, the fuse F has a small resistance of about 100 ohms when it is in the unblown state, but an internal resistance between the drain D1 and the source S1 of the first FET Tr1 is about a few Meg-ohms. Usually, the fuse circuits of the prior art are used in such a condition. After the fuse has been blown, occasionally, a gap of the fuse terminals becomes leaky in performance. This is so called as "re-glown fuse" or "glown-back fuse". A change of the resistance $R_F$ is caused by moisture or contamination of the gap of the fuse terminals. For example, when the resistance $R_F$ of the fuse F is decreased from 3 meg-ohms to 2 meg-ohms by the glown back fuse, the input of the inverter INV is changed from the high potential level "H" to low potential level "L". Thus, the fuse circuit operates erroneously, and the trimming circuit is out of control.

Therefore, in order to bring the conventional fuse circuit to a desired level, it is required to provide the IC with a fuse which does not malfunction by leaking, and it is desirable to provide a circuit which detects the fuse condition.

SUMMARY OF THE INVENTION

It is an object of the present invention to provide a fuse circuit which does not malfunction due to improper behavior of a fuse that has blown (glown-back fuse or re-glown fuse).

It is another object of the present invention to provide a fuse circuit which generates a judging potential corresponding to a fuse condition.

It is still another object of the present invention to provide a fuse circuit to detect whether a fuse has blown or not by judging whether the fuse resistance is larger or smaller compared with a predetermined threshold resistor.

It is a further object of the present invention to provide a fuse circuit which can accurately judge whether the fuse has been blown or not.

The foregoing objects are attained by providing an integrated fuse circuit having two circuits connected in series. One is a fuse circuit including a transistor and a fuse, the other is a circuit including transistors and predetermined threshold resistor. Both circuits are connected in series across a supply voltage source. A judging potential is obtained from the junction point of these two circuits.

Further details and advantages of the present invention will become clear from the accompanying drawings and the detailed description of preferred embodiments.

BRIEF DESCRIPTION OF THE DRAWINGS

The same or like reference numerals denote the same or like parts throughout the drawings.

DETAILED DESCRIPTION OF PREFERRED EMBODIMENTS

Figure 2:
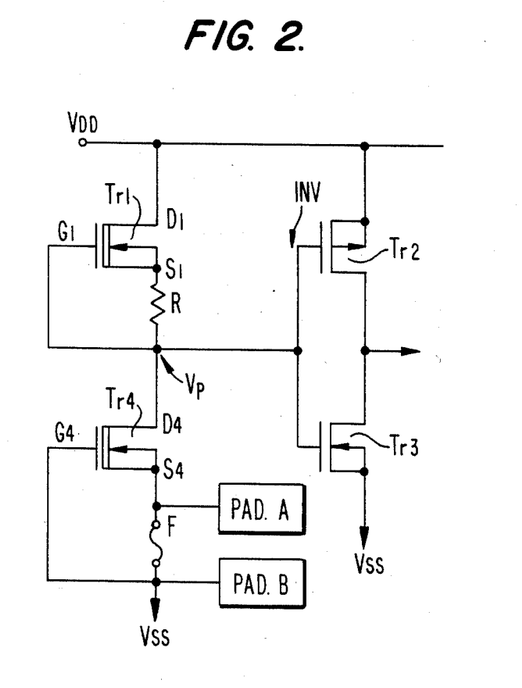
FIG. 2 is an embodiment of a fuse circuit by the present invention.

FIG. 2 is an embodiment of a fuse circuit by the present invention. In order to provide a function of a constant current characteristic, an impedance element of the first n-channel depletion field effect transistor (FET) Tr1 is provided with a predetermined threshold resistor R between its gate G1 and source S1. Similarly, the second FET Fr4 is provided with a fuse F between its gate G4 and source S4. These FETs are connected in series between a positive voltage $V_{DD}$ and a negative voltage $V_{SS}$. A junction point between the gate G1 of the second FET Tr1 and a drain D4 of the second FET Tr4 is connected to an input of an inverter INV for example to detect whether the fuse has blown or not. The inverter INV is composed of complementary metal oxide semiconductor (CMOS) transistor Tr2 and an n-channel MOS transistor Tr3.

For the impedance element including the first FET Tr1 and the threshold resistor R, a resistor R is mainly used, whose resistance is selected to be a few Kilo-ohms, this value being determined for judging from the value of the resistance whether the fuse is blown or not. The value of this resistance is not critical. The first and the second FETs Tr1 and Tr4 are designed to have the same size and to be fabricated on the same chip together with the threshold resistor R and the fuse F, and the fabrication method is the same as the conventional IC fabrication process.

The circuit of FIG. 2 functions as follows. The gate voltage $V_{G1}$ of the first FET Tr1 is decreased by the resistor R, and the first FET Tr1 is used as a resistor equivalent. Similarly, the gate voltage $V_{G4}$ of the second FET Tr4 is also decreased by the resistance of the fuse F, and the second FET Tr4 is also used as a resistor equivalent. Therefore, when the supply voltage is applied in series across the circuit, a divided voltage Vp appears at the junction point between the gate G1 of the first FET Tr1 and the drain D4 of the second FET Tr4. The divided voltage Vp is proportional to the ratio of equivalent resistances of the first FET Tr1 to the second FET Tr4. As a result, the divided voltage Vp is varied by the fuse condition (that is, whether the fuse has been blown or not). The divided voltage Vp is applied to an input terminal of the inverter INV, for example, as shown in FIG. 2, and the circuit is judged as to whether the fuse is blown or not. The potential of the divided voltage Vp is also referred to as a "judging potential Vp".

Generally, when the fuse F is unblown and in the conductive state it has a small resistance of about 100 ohms, but when the fuse has blown, it has a very high resistance, of the order of many meg-ohms. In FIG. 2 the judging potential Vp is mainly determined by the ratio of the equivalent resistance $R_1$ of the first FET Tr1 and the equivalent resistor $R_4$ of the second FET Tr4. For example, when the equivalent resistance $R_1$ of Tr1 is equal to the resistance $R_4$ of Tr4, and also the threshold resistor R is equal to the resistance $R_F$ of the fuse F, the judging potential Vp becomes half of the positive voltage source $(V_{DD}-V_{SS})/2$ where $V_{DD}$ and $V_{SS}$ are a first power supply means having a positive voltage and a second power supply means having a negative voltage source respectively. In such a condition, when the fuse resistance $R_F$ is larger than the resistor R, the judging potential Vp becomes a high potential level "H". Similarly, when the fuse resistance $R_F$ is smaller than that of the threshold resistor R, the judging potential Vp becomes the low potential level "L". Thus, the resistor R can be used as a threshold element, which is called a "threshold resistor R". This is one feature of the present invention.

In order to make clear the advantage of the present invention, for example, when the threshold resistance R is set at 10 K-ohms and the fuse has blown, then the high potential "H" appears at an input terminal of the inverter INV until the value of the fuse resistance $R_F$ decreases to 10 K-ohms. Accordingly, though the fuse or the gap between the fuse terminals is contaminated or moistened or the glown-back condition of the fuse occurs, the high potential "H" is held stably until the fuse resistance $R_F$ is decreased below 10 K-ohms. Thus, the output level of the fuse circuit indicates whether the fuse has been blown ("H") or is unblown ("L"), and it is possible to judge this without error. Moreover, by using the threshold resistor R, it is possible to adjust the fuse resistance $R_F$ to a specified design value without affecting other circuit components. It is a very convenient feature of the present invention that it can be applied to various trimming or controlling circuit of IC devices.

As has been described above, the fuse circuit of the present invention is formed by adding a simple circuit (impedance elements, for example FETs and resistors etc.) to a conventional fuse circuit (the first FET Tr1 and a fuse F etc.). Fabrication of such a circuit is easy by applying a conventional fabrication process for ICs.

Figure 3:
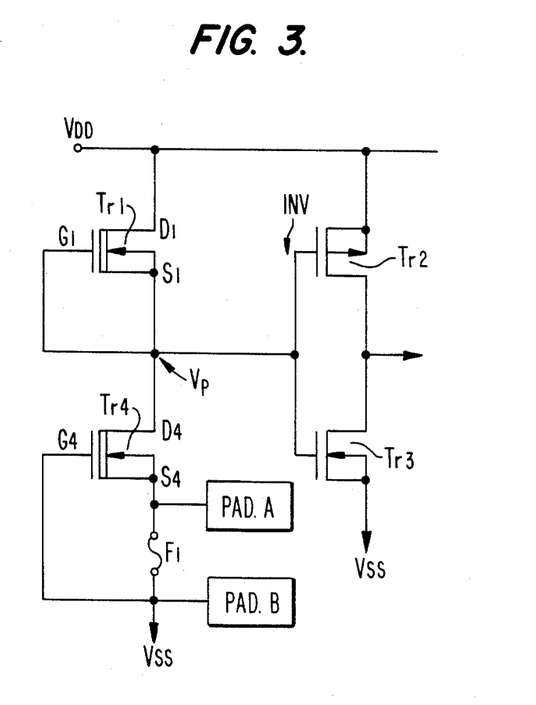
FIG. 3 is another embodiment of a fuse circuit diagram by the present invention.

FIG. 3 shows another embodiment of a fuse circuit by the present invention. FIG. 3 is similar to the circuit of FIG. 2 except that the threshold resistor R is eliminated. The same or like reference numerals denote the same or like parts throughout the drawings. In such a circuit, each equivalent resistance of the FETs Tr1 and Tr4, the circuit of FIG. 3 can be considered to be equivalent to that of FIG. 2.

Figure 4A:
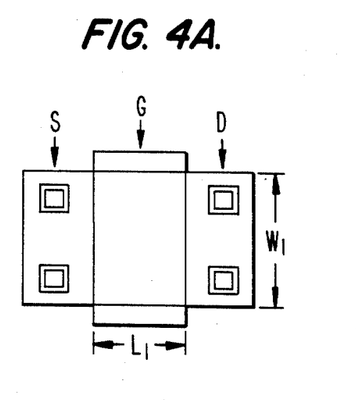
FIGS. 4A and 4B are exemplary plan views of patterns of the transistors used in the circuit of FIG. 3, wherein the pattern of 4A gives higher on-state resistance.
Figure 4B:
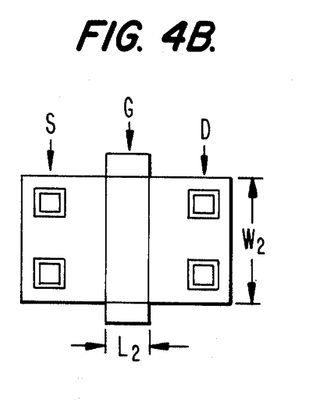

The equivalent resistance may be varied by changing the shape or size of the transistors. For example, FIGS. 4A and 4B show a fragmentary plan view of metal oxide semiconductor field effect transistors (MOSFET) applicable to the present invention. The figures show schematically a plan view of the layout of the MOSFET. An internal resistance of the FET is inversely proportional to W/L, the ratio of the width W to the length L of its gate electrode G. In the figures, there are two basic types of the FETs. That is, FIG. 4A has a smaller ratio of $W_1/L_1$, and FIG. 4B has a larger ratio of $W_2/L_2$, so that the on-state resistance of the FET of the pattern shown in FIG. 4A is larger than that of the pattern shown in FIG. 4B.

In the circuit of FIG. 3, the first FET Tr1 should be formed to have a structure having a small ratio of $W_1/L_1$, and the second FET Tr4 should be formed to have a structure having a large ratio for $W_2/L_2$. The reason for such selection of ratio W/l is discussed below with respect to FIG. 6, namely regarding circuit stability. In this case, the judging potential Vp appears on the junction point of the gate G1 of the first FET Tr1 and the drain D4 of the second FET Tr4. When the fuse is in an unblown state, then the judging potential $V_p$ between the first transistor Tr1 and the second FET Tr4 is reduced, and the judging potential Vp of an input of the inverter INV becomes low potential level "L". Similarly, when the fuse has blown, the judging potential Vp becomes high potential level "H".

The experimental results will be described briefly. The width $W_1$ and the length $L_1$ of the gate electrode G1 of the first FET Tr1 are designed as 8 μm, and 20 μm respectively, so the W1/L1 ratio is 8/20. Similarly, the ratio of $W_2/L_2$, for the second FET Tr4 is selected to be from 8/18 to 8/16. It was found that with use of such size FETs the circuit of FIG. 3 showed a stable operation for a fuse of a few K-ohms. The IC using such a fuse circuit operates without suffering from misjudgment as to whether the fuse has blown or not. The reason for the stability is described below with respect to FIGS. 5 and 6.

According to the embodiment, shown in FIG. 3, the equivalent resistance of the FETs Tr1 and Tr4, and hence the judging potential Vp for judging whether the fuse has been blown or not, is determined by the relative ratio of the onstate resistance of the FETs. It is determined by the ratio of W/L of the two FETs ($W_1/L_1$:$W_4/L_4$). Therefore, the threshold resistor R, as shown in FIG. 2, is not necessary. This is effective to simplify the fabrication process, because the FETs Tr1 and Tr4 can be fabricated in the same process for fabricating the other transistors in the IC, and there is no need to add the process for fabricating the resistances.

Figure 5A:
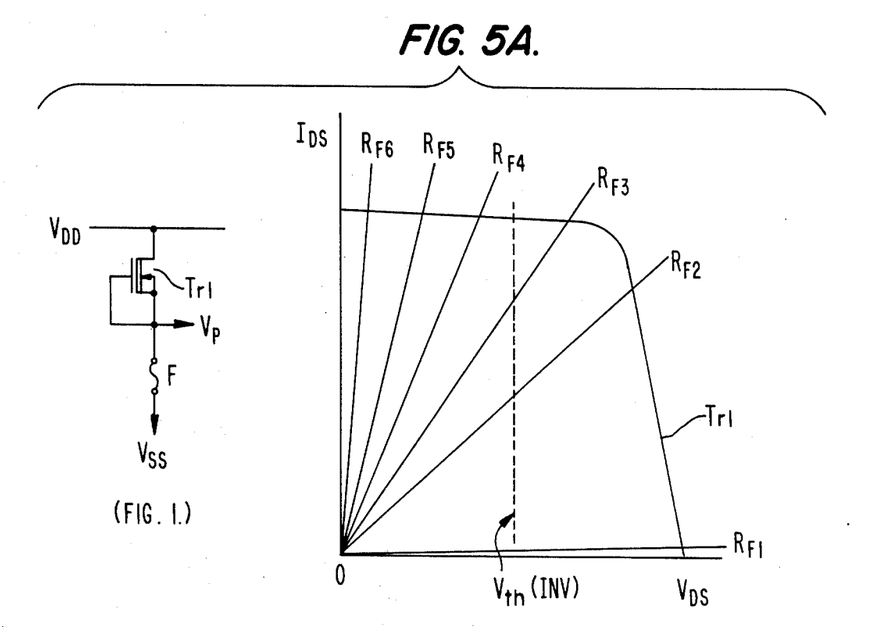
FIG. 5A is a graph showing the voltage-current characteristics of the first FET and the fuse conditions as varying by the resistances as shown in FIG. 1.

Now the circuit stability will be discussed. FIG. 5A is a graph showing the voltage-current characteristics of the first FET and the fuse condition varying by its resistance as shown in FIG. 1. THe horizontal line (X-axis) is the drain-source voltage $V_{DS}$, and the vertical line (Y-axis) is the drain-source current $I_{DS}$. The inverter input threshold voltage $V_{th}$ (INV) indicates low potential level "L", and the right hand side indicates high potential level "H". The curve of the first FET Tr1 is reversed as can be seen in the figure. The resistance $R_F$ of the fuse F can vary during circuit operation, corresponding to lines ($R_{F1}$ ... $R_{F6}$) are given as a parameter of the resistances $R_F$ of the fuse F. This can be expressed as:

$$R_{F6} < R_{F5} < R_{F4} < E_{F3} < R_{F2} < R_{F1}]$$

where the line $R_{F1}$ shows the fuse in the blown state, the lines $R_{F2}$, $R_{F3}$, $R_{F4}$ and $R_{F5}$ show the glown-back fuse state, and the line $R_{F6}$ shows that the fuse is unblown and is in the conductive state. The cross point of these lines and the curve show the judging potential Vp of the fuse circuit. As can be seen in the figure, when the resistance $R_F$ of the fuse F becomes smaller than that of the fuse in the blown state, the judging potential Vp is reduced from "H" to "L", thus changing the inverter threshold voltage $V_{th}$. For example, the cross points of the $R_F5$ and $R_{F5}$ lines show the low potential level "L" corresponding to the conductive state. Accordingly, the fuse circuit in the prior art operates in error, and the trimming circuit is out of control.

Figure 5B:
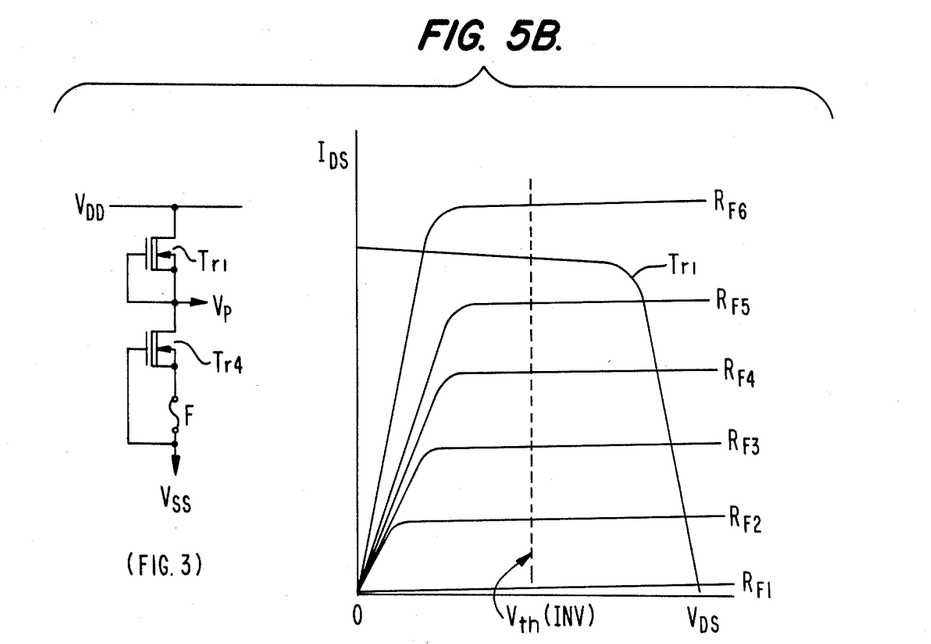
FIG. 5B is a graph showing the voltage-current characteristics of the first FET and the fuse conditions as varying by the resistances as shown in FIG. 3.

FIG. 5B is a graph showing the voltage-current characteristics of the first FET Tr1 and the fuse conditions varying in resistance as shown in FIG. 3. The same or like reference numerals denote the same or like parts throughout the drawings. As can be seen in the figure, if the resistance $R_F$ of the fuse F becomes smaller than that of the fuse in the blown state, the judging potential Vp is held in the high potential level "H" because of non-linearity of the characteristics of the second FET. For example, though the cross points of the $R_{F4}$ and $R_{F5}$ lines are shown in the glown-back fuse state, the judging potential Vp is held at the high potential level "H", which is a higher level than that of the inverter threshold voltage $V_{th}$ (INV). Accordingly, the fuse circuit of the present invention operates with high accuracy.

Figure 6A:
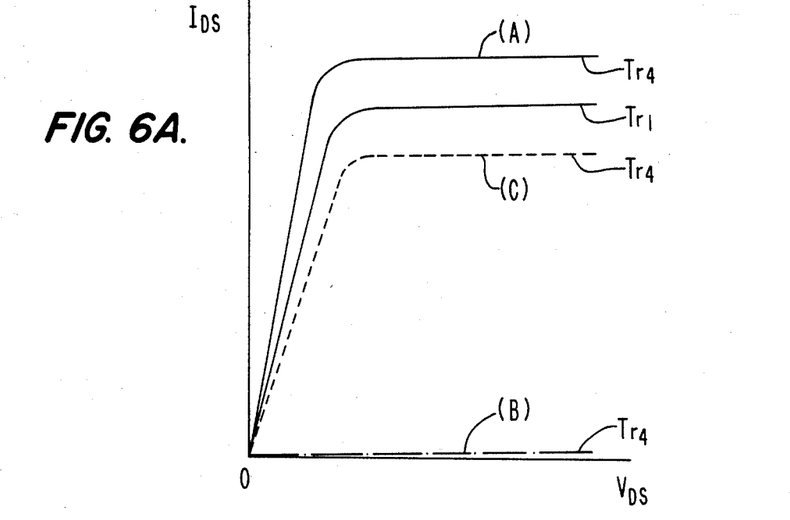
FIGS. 6A and 6B are graphs showing the voltage-current characteristics respectively of the first and second FETs in the circuit of FIG. 3.

FIG. 6A is a graph showing the voltage-current characteristics of the first and the second FETs as shown in FIG. 3. In the figure, the horizontal line (X-axis) is the drain-source voltage $V_{DS}$, and the vertical line (Y-axis) is the drain-source current $I_{DS}$. FIG. 6A is shown to meet the requirement that a drain-source current $I_{DS}$ of the second FET Tr4 is larger than that of the first FET Tr1, and that the resistance $R_F$ of the fuse F is smaller than that of these FETs. The voltage-current characteristic of the second FET Tr4 is varied by the fuse conditions. The curve (A) shows the state when the fuse F is unblown and in the conductive condition, the curve (B) shows the state when the fuse F has been blown, and the curve (C) shows the state when the fuse F is in a "glown-back fuse" condition.

Figure 6B:
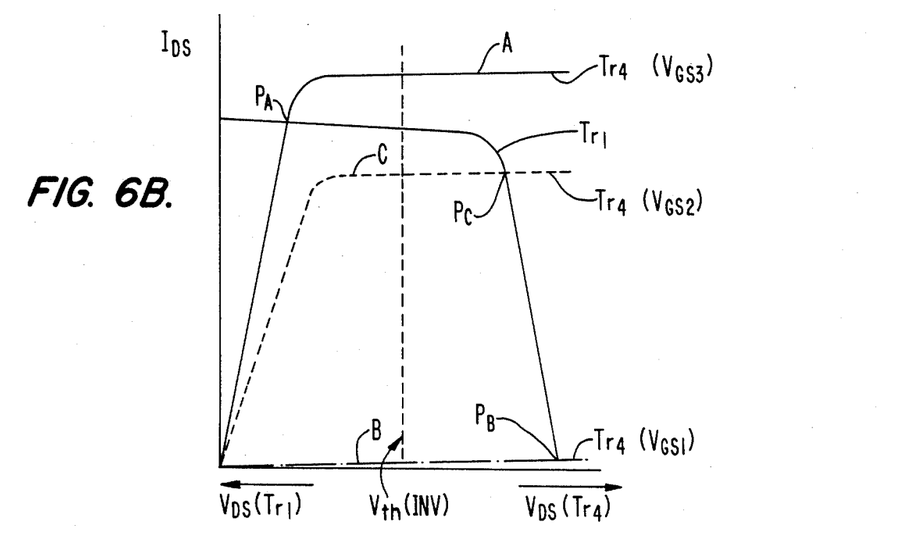

FIG. 6B is a graph for illustrating the stability of operating-point. In the figure, the graph is composed of the voltage-current characteristics of the first and the second FETs as shown in FIG. 3. In the figure, the horizontal line (X-axis) is the drain-source voltage $V_{DS}$, and the vertical line (Y-axis) is the drain-source current $I_{DS}$. FIG. 6A is shown to meet the requirement that a drain-source current $I_{DS}$ of the second FET Tr4 is larger than that of the first FET Tr1, and that the resistance $R_F$ of the fuse F is smaller than that of these FETs. The voltage-current characteristic of the second FET Tr4 is varied by the fuse conditions. The curve (A) shows the state when the fuse F is unblown and in the conductive condition, the curve (B) shows the state when the fuse F has been blown, and the curve (C) shows the state when the fuse F is in a "glown-back fuse" condition.

FIG. 6B is a graph for illustrating the stability of operating-point. In the figure, the graph is composed of the voltage-current characteristics of the first and the second FETs Tr1 and Tr4 as shown in FIG. 6A.

The sum of two voltages between the source and drain of the first FET Tr1 and the second FET Tr4 can be expressed as:

$$V_{DS}(Tr1) + V_{DS}(Tr4) \qquad (2)$$

This is equal to a supply voltage source $(V_{DD} - V_{ss})$ subtracted by the voltage drop of the fuse $(I_D \times R_F)$, so that $$V_{DS}(Tr1) + V_{DS}(Tr4) = (V_{DD} - V_{ss}) - (I_D \times R_F) \qquad (3)$$

FIG. 6B shows the above relation. As mentioned above, the circuit is operated in a constant current mode, so that the right hand side of equation (3) is considered as constant. The FETs Tr1 and Tr4 are considered to be a load for each other, so that the relation of equation (3) is as shown in FIG. 6B, wherein the curve of the first FET Tr1 in FIG. 6A is reversed as can be seen in the figure. If the conditions as follows are satisfied in the second FET Tr4, $$V_{GS} = V_G - V_S \qquad (4)$$

and, $$V_{GS1} < V_{GS2} < V_{GS3} \qquad (5)$$

Then the cross points $P_A$, $P_B$ and $P_C$ of these lines can be indicated the operating points of the FETs for the cases when the fuse is in the unblown, blown and glown-back states, respectively. For the operating point $P_A$, the drain-source current $I_{DS}$ (Tr1) of the first FET Tr1 is equal to that of the second FET Tr4, which can be expressed as:

$$I_{DS}(Tr1) = I_{DS}(Tr4) \tag{6}$$

From the above equation, the internal resistances of the FETs at the operating point can be determined. This can be used for determining the W/L ratio of these FETs. As can be seen in the figure, the voltage of the point $P_A$ is a low voltage indicating that the fuse is unblown. The point $P_B$ is high potential level "H" indicating that the fuse has blown. If the fuse is in the glown-back state, the operating point shifts to the point $P_C$, but even at this point the judging potential Vp is still at high potential level "H". For the case that the resistance $R_F$ of the fuse F in the circuit of FIG. 1 (prior art) has a glown-back resistance of one meg-ohm, the judging potential Vp becomes less than half of the supply voltage $V_{DD} - C_{SS}$ ("L") as an input threshold voltage $V_{th}$ of the inverter INV, so it is judged to be unblown.

Moreover, it will be understood from FIG. 6B, it is necessary, as mentioned above, that the first FET Tr1 should have a smaller saturation current than that of the second FET Tr4. If the saturation current of the first FET Tr1 is larger than that of the second FET Tr4, the operation point $P_A$ will come to the right hand side of the figure, to indicate high potential level "H" of the judging potential Vp.

In the above disclosure, the n-channel depletion FETs have been used, but will be clear for one skilled in the art that p-channel FETs or enhancement FETs may be used.

Figure 7A:
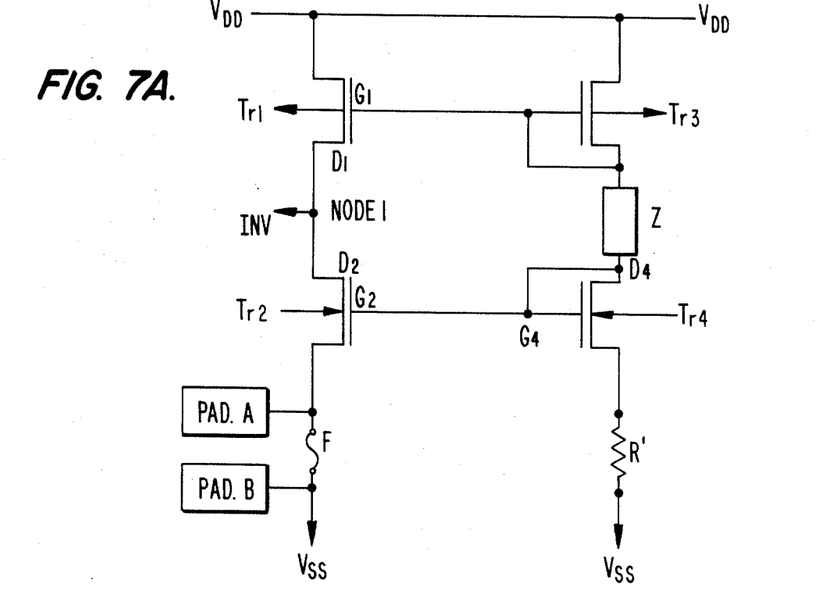
FIGS. 7A and 7B are still another embodiment of a fuse circuit by the present invention applied to a CMOS circuit.
Figure 7B:
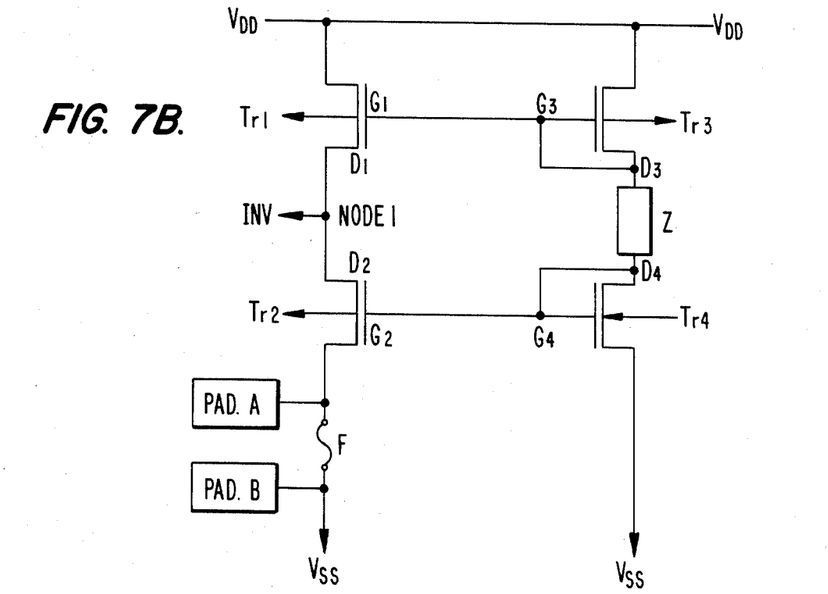

FIGS. 7A and 7B show still other embodiments of a fuse circuit according to the present invention as applied to a CMOS circuit. In the figures, the circuit of FIG. 7A functions similarly to the circuit of FIG. 2, and the circuit of FIG. 7B corresponds to the circuit of FIG. 3, namely wherein the resistor R of FIG. 2 is incorporated in the other circuit elements as in the embodiment of FIG. 3. Accordingly, details concerning the operation of FIG. 7B are omitted here. In FIG. 7A, in order to provide a constant current supply source, the first enhancement type p-channel FET Tr1, the second enhancement type n-channel FET Tr2 and the fuse F are connected in series between a positive source $V_{DD}$ and a negative voltage source $V_{SS}$. In such a fuse circuit, an output terminal (NODE 1) is arranged at the center point between the drain D1 of the first FET Tr1 and drain D2 of the second FET Tr2. Similarly, the third enhancement type p-channel FET Tr3, limiting impedance element Z (supplied by the resistance of a transistor or resistor), the fourth enhancement type n-channel FET Tr4 and a threshold resistor R' are connected in series between a positive source $V_{DD}$ and a negative voltage source $V_{SS}$. In such a reference voltage supply circuit, a gate G3 of the third FET Tr3 is connected to its drain D3, and is also connected to a gate G1 of the first FET Tr1 (The circuit including Tr1, Tr3 and Z forms a mirror circuit). Similarly, a gate G4 of the fourth FET Tr4 is connected to its drain D-4, and to the gate G2 of the second FET Tr2 respectively. Due to the mirror circuit, the current flowing through Tr2 and fuse F, and Tr4 and resistance R, are equal.

The disclosure above in connection with the FETs Tr1 and Tr4 in FIGS. 2 and 3 has been made with depletion type nchannel FETs, but the embodiment of the present invention shown in FIG. 7A uses enhancement type p-channel and enhancement type n-channel FETs. Accordingly, the first and second FETs Tr1, Tr2 are enhancement type FETs having respective constant potentials applied to their gates. In order to be varied in correspondence to the resistance $R_F$ of the fuse F, the constant voltages are applied to the gate G1 of the first FET Tr1 and the gate G2 of the second FET Tr2 from the reference voltage supply circuit.

In FIG. 7A, when the resistance $R_F$ of the fuse F is equal to the resistor R', and the values of the fuse circuit elements are determined to be an output voltage of $(V_{DD} + V_{SS})/2$ as an input threshold voltage $V_{th}$ of the inverter INV, then the resistance $R_F$ of resistor R' determines the threshold value of the fuse F.

In FIG. 7B, for example, if the fuse circuit of the present invention is composed of a combination circuit wherein the W1/L1 ratio of the first FET Tr1 is equal to the W3/L3 ratio of the third FET Tr3, and that of the second FET Tr2 is equal to that of the fourth FET Tr4, this provides a combination circuit with the relative ratio of the on-state resistances of the transistors, satisfying, for instance, the relation indicated by Tr1/Tr3 < Tr2/Tr4.

It will be also clear that the on-state resistance of the FETs can be varied not only by varying the ratio W/L but also by other methods. These modifications are possible and they are all within the scope of the present invention.

The fuse circuit components used in the above disclosure, namely the impedance elements such as transistors, resistors and the fuse, are all well known and conventional, and may be fabricated on an IC die or chip. Moreover the method of fabricating such semiconductor devices are all well known in the art, and any kind of fabrication method for the semiconductor device is applicable.

The present invention may be embodied in other specific forms without departing from the spirit or essential characteristic thereof. The presently disclosed embodiments are, therefore, to be considered in all respects as illustrative and not restrictive, the scope of this invention being indicated by the appended claims, rather than the foregoing description, and all changes which come within the meaning and range of equivalency of the claims are, therefore, to be embraced therein.

What is claimed is:

1. A detection circuit for an integrated circuit having a fuse with first and second terminals and said detection circuit for detecting whether the fuse has blown, said detection circuit comprising:

a first voltage source supplying a first voltage;

a second voltage source, coupled to the first terminal of the fuse, supplying a second voltage lower than the first voltage;

a first circuit comprising a first transistor, having a source coupled to the second terminal of the fuse and a gate coupled to the first terminal of the fuse; and a second circuit comprising:

a second transistor having a source and a gate; and a resistor, coupled between the source and gate of said second transistor, said first and second circuits being coupled in series between said first and second voltage sources at a junction point, generating a detection signal, indicating whether the fuse has been blown, at said junction point.

2. a circuit as set forth in claim 1, wherein the resistance of said resistor is equivalent to that of said fuse when said fuse has not been blown.

3. A circuit as set forth in claim 1, wherein said first and said second transistors comprise depletion type transistors.

4. An integrated circuit as set forth in the claim 1, wherein said first transistor is an enhancement type transistor, and means are provided for holding the gate thereof at a constant potential.

5. A detection circuit for an integrated circuit having a fuse which has first and second terminals, said detection circuit detecting whether the fuse has blown, said detection circuit comprising:
a first voltage source supplying a first voltage;
a second voltage source, coupled to the first terminal of the fuse, supplying a second voltage lower than the first voltage;
a first circuit, comprising a first transistor having a source coupled to the second terminal of the fuse and a gate coupled to the first terminal of the fuse; and
a second circuit, comprising a second transistor having a source and a gate coupled to each other, said first and said second circuits being coupled in series between said first and said second voltage sources at a junction point and generating a detection signal, indicating whether the fuse has been blown, at said junction point.

6. A detection circuit for an integrated circuit having a fuse which has first and second terminals and said detection circuit detects whether or not said fuse has blown, said detection circuit comprising:
a first voltage source supplying a first voltage;
a second voltage source, coupled to the first terminal of the fuse, supplying a second voltage lower than the first voltage;
a first circuit comprising a first transistor, having a source coupled to the second terminal of the fuse; and
a second circuit comprising a second transistor, having a source and a gate;
a mirror circuit comprising a third transistor, a fourth transistor, and an impedance element, said third and said fourth transistors each having a gate, a source, and a drain, the sources of said third and said fourth transistors being connected to said first voltage source, the gates of said third and said fourth transistors being coupled to each other, the gate of said fourth transistor being further connected to the drain of said fourth transistor, said impedance element being connected between the drain of said fourth transistor and said second circuit, said first circuit being connected between the drain of said third transistor and said second voltage source, said second circuit being connected between said impedance element and said second voltage source, the gates of said first and said second transistors being connected to each other, and said first and said second circuits being coupled in parallel with each other and coupled to said mirror circuit, a detection signal indicating a blown condition of said fuse being generated at the drain of said third transistor.

7. A circuit according to claim 6, further comprising a resistor coupled between the source of said second transistor and the second voltage source.

8. A circuit as recited in claim 7, wherein the resistance of said resistor is equivalent to that of said fuse when said fuse has not been blown.

9. A circuit as recited in claim 5, wherein said first and said second transistors are depletion type transistors.

10. A circuit as recited in claim 6, wherein said first, said second, said third, and said fourth transistors are enhancement type transistors.

11. A circuit as recited in claim 5, wherein said first and said second transistors each have a channel width W and a channel length L and where the ratio W/L of said second transistor is smaller than that of said first transistor.

12. A circuit as recited in claim 6, wherein said first and said second transistors each have a channel width W and a channel length L and where the ratio W/L of said second transistor is smaller than that of said first transistor.

* * * * *

UNITED STATES PATENT AND TRADEMARK OFFICE
CERTIFICATE OF CORRECTION

PATENT NO. : 4,730,129

DATED : March 8, 1988

INVENTOR(S) : Kunitoki et al.

It is certified that error appears in the above-identified patent and that said Letters Patent is hereby corrected as shown below:

Col. 3, line 62, "$V_DD$" should be --$V_{DD}$--.

Col. 4, lines 32-33, "climinated" should be --eliminated--.

Col. 5, line 38, "$E_{F3}$" should be --$R_{F3}$--;

line 50, "$R_F5$" should be --$R_{F4}$--.

Col. 9, line 9, delete "the".

Signed and Sealed this

Nineteenth Day of July, 1988

Attest:

DONALD J. QUIGG

*Attesting Officer*  *Commissioner of Patents and Trademarks*